(12) United States Patent
Bathan et al.

(10) Patent No.: US 8,937,393 B2
(45) Date of Patent: Jan. 20, 2015

(54) INTEGRATED CIRCUIT PACKAGE SYSTEM WITH DEVICE CAVITY

(75) Inventors: Henry Descalzo Bathan, Singapore (SG); Zigmund Ramirez Camacho, Singapore (SG); Lionel Chien Hui Tay, Singapore (SG); Frederick Rodriguez Dahilig, Singapore (SG)

(73) Assignee: STATS ChipPAC Ltd., Singapore (SG)

(*) Notice: Subject to any disclaimer, the term of this patent is extended or adjusted under 35 U.S.C. 154(b) by 1593 days.

(21) Appl. No.: 11/744,062

(22) Filed: May 3, 2007

(65) Prior Publication Data
US 2008/0272479 A1   Nov. 6, 2008

(51) Int. Cl.
| H01L 21/683 | (2006.01) |
| H01L 21/56 | (2006.01) |
| H01L 23/31 | (2006.01) |
| H01L 23/495 | (2006.01) |
| H01L 23/00 | (2006.01) |

(52) U.S. Cl.
CPC ... *H01L 23/49575* (2013.01); *H01L 2924/1815* (2013.01); *H01L 2924/16195* (2013.01); *H01L 2224/48091* (2013.01); *H01L 2224/48247* (2013.01); *H01L 21/6835* (2013.01); *H01L 21/565* (2013.01); *H01L 23/3107* (2013.01); *H01L 24/48* (2013.01)
USPC .................... 257/787; 257/E21.499; 438/106

(58) Field of Classification Search
USPC ............................ 257/787, E21.499; 438/106
See application file for complete search history.

(56) References Cited

U.S. PATENT DOCUMENTS

| 6,242,285 | B1 | 6/2001 | Kang |
| 6,384,473 | B1 | 5/2002 | Peterson et al. |
| 6,535,388 | B1 | 3/2003 | Garcia |
| 6,713,857 | B1 * | 3/2004 | Tsai ............................ 257/686 |
| 6,924,540 | B2 | 8/2005 | Shirakawa et al. |
| 6,998,721 | B2 | 2/2006 | Zhou |
| 2004/0089859 | A1 * | 5/2004 | Shirakawa et al. ............ 257/1 |
| 2005/0090050 | A1 * | 4/2005 | Shim et al. .................... 438/200 |
| 2005/0205979 | A1 * | 9/2005 | Shin et al. ..................... 257/678 |
| 2005/0224968 | A1 * | 10/2005 | Ho ................................ 257/737 |

OTHER PUBLICATIONS

Definition of "facing"; "Merriam-Webster's Collegiate Dictionary", Tenth Edition, 1994, p. 415, Publisher: Merriam-Webster, Incorporated, Springfield, MA, USA.

* cited by examiner

*Primary Examiner* — Matthew Gordon
(74) *Attorney, Agent, or Firm* — Ishimaru & Associates LLP

(57) ABSTRACT

An integrated circuit package system is provided including connecting an integrated circuit die with an external interconnect, forming a first encapsulation having a device cavity with the integrated circuit die therein, mounting a device in the device cavity over the integrated circuit die, and forming a cover over the device and the first encapsulation.

10 Claims, 10 Drawing Sheets

INTEGRATED CIRCUIT PACKAGE SYSTEM WITH DEVICE CAVITY

TECHNICAL FIELD

The present invention relates generally to an integrated circuit package system, and more particularly to an integrated circuit package system with encapsulating features.

BACKGROUND ART

Increased miniaturization of components, greater packaging density of integrated circuits ("ICs"), higher performance, and lower cost are ongoing goals of the computer industry. As new generations of IC products are released, the number of devices used to fabricate them tends to decrease due to advances in technology. Simultaneously, the functionality of these products increases.

Semiconductor package structures continue to advance toward miniaturization and thinning to increase the density of the components that are packaged therein while decreasing the sizes of the products that are made therefrom. This is in response to continually increasing demands on information and communication apparatus for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook personal computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor die (or "chip") packages are of the type where a semiconductor die is molded into a package with a resin, such as an epoxy molding compound. The packages have a lead frame whose leads are projected from the package body, to provide a path for signal transfer between the die and external devices. Other conventional package configurations have contact terminals or pads formed directly on the surface of the package.

Such a conventional semiconductor package is fabricated through the following processes: a die-bonding process (mounting the semiconductor die onto the paddle of a lead frame), a wire-bonding process (electrically connecting the semiconductor die on the paddle to inner leads using lead frame wires), a molding process (encapsulating a predetermined portion of the assembly, containing the die, inner leads and lead frame wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

An exemplary semiconductor package, well known in the electronics industry, is the quad flat package ("QFP"). QFP packages typically comprise a lead frame, such as a conductive sheet stamped and etched, with a semiconductor die having a multitude of bond pads mounted to the top side of the lead frame. Wire bonds electrically connect the bond pads, of the semiconductor die, to a series of conductive lead fingers on the topside of the lead frame. Typically, the semiconductor die and the wire bonds are encapsulated within a molding compound.

In order to reduce manufacturing costs, the electronics industry is increasing the usage of QFP packages. In the manufacturing process, many obstacles must be overcome to deliver extremely small packages with thinner and thinner profile in high volume. Despite the trend towards miniaturization and thinner profile, more functions and more integrated circuits are continued to be packed into QFP packages.

Thus, a need still remains for an integrated circuit package system providing low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including connecting an integrated circuit die with an external interconnect, forming a first encapsulation having a device cavity with the integrated circuit die therein, mounting a device in the device cavity over the integrated circuit die, and forming a cover over the device and the first encapsulation.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
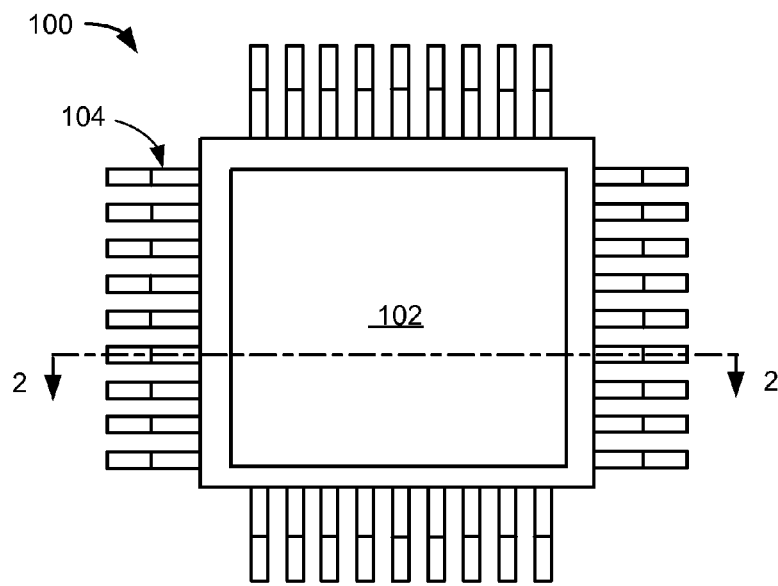
FIG. 1 is a bottom view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a bottom view of an integrated circuit package system 100 in a first embodiment of the present invention. The bottom view depicts a first encapsulation 102, such as an epoxy molded compound, with external interconnects 104 extending therefrom. The external interconnects 104 may be a number of types of leads. For example, the external interconnects 104 may be leads for a quad flat package.

For illustrative purposes, the external interconnects 104 are shown extending from the first encapsulation 102, although it is understood that the external interconnects 104 may not extend from the first encapsulation 102. For example, the external interconnects 104 may be within and exposed by the first encapsulation 102.

Figure 2:
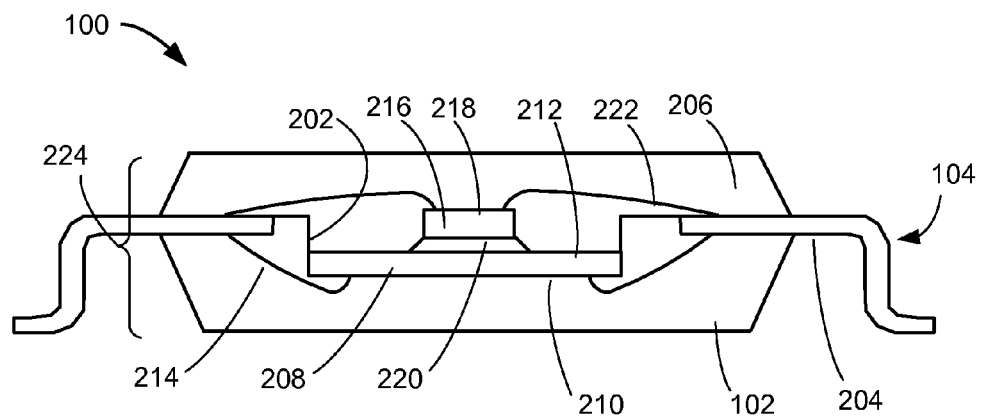
FIG. 2 is a cross-sectional view of the integrated circuit package system of FIG. 1 along a line 2-2.

Referring now to FIG. 2, therein is shown a cross-sectional view of the integrated circuit package system 100 of FIG. 1 along a line 2-2. The cross-sectional view depicts the first encapsulation 102 having a device cavity 202 extending below a first portion 204 of the external interconnects 104. The cross-sectional view also depicts a cover 206, such as an epoxy molding compound, over the first encapsulation 102.

A first integrated circuit die 208 having a first active side 210 and a first non-active side 212 is preferably in the device cavity 202. The first active side 210 preferably faces the first encapsulation 102 and the first non-active side 212 faces upwards and away from the first encapsulation 102. First lower interconnects 214, such as bond wires or ribbon bonds, connect the first active side 210 and a predetermined selection of the external interconnects 104.

The first encapsulation 102 covers the first active side 210 and exposes the first non-active side 212 in the device cavity 202. The first encapsulation 102 also covers the first lower interconnects 214. The first encapsulation 102 covers the inner portion of the first portion 204 of the external interconnects 104.

A first device 216, such as an integrated circuit die, having a first non-passive side 218 and a first passive side 220 is preferably over the first integrated circuit die 208 and in the device cavity 202. The first passive side 220 faces the first non-active side 212. First upper interconnects 222, such as bond wires or ribbon bonds, connect the first non-passive side 218 and a predetermined selection of the external interconnects 104.

The cover 206 covers the first device 216, the first upper interconnects 222, the first non-active side 212, and the inner portion of the first portion 204 of the external interconnects 104. A non-horizontal cover side of the cover 206 faces a non-horizontal encapsulation side of the first encapsulation 102. The cover 206 fills the device cavity 202. The first encapsulation 102 and the cover 206 form a hermetic interface with each other forming a package encapsulation 224 for the integrated circuit package system 100.

Figure 3:
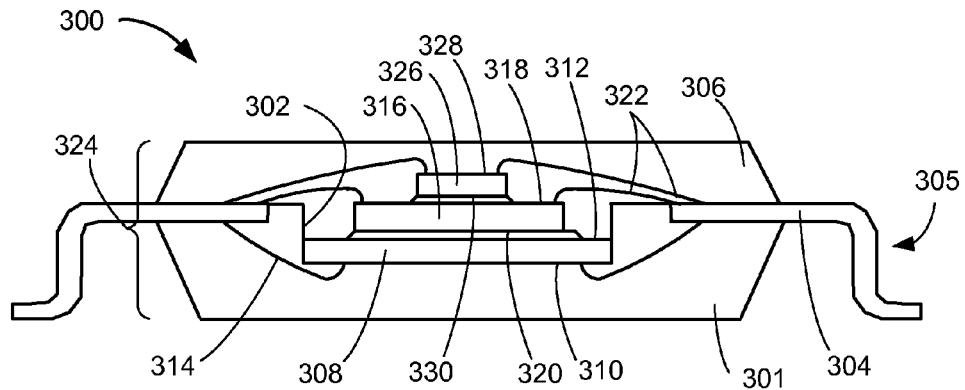
FIG. 3 is a cross-sectional view of an integrated circuit package system along line 2-2 of a bottom view as exemplified by FIG. 1 in a second embodiment of the present invention.

Referring now to FIG. 3, therein is shown a cross-sectional view of an integrated circuit package system 300 along line 2-2 of a bottom view as exemplified by FIG. 1 in a second embodiment of the present invention. The cross-sectional view depicts a first encapsulation 301 having a device cavity 302 extending below a first portion 304 of external interconnects 305. The cross-sectional view also depicts a cover 306, such as an epoxy molding compound, over the first encapsulation 301.

A first integrated circuit die 308 having a first active side 310 and a first non-active side 312 is preferably in the device cavity 302. The first active side 310 preferably faces the first encapsulation 301 and the first non-active side 312 faces upwards and away from the first encapsulation 301. First lower interconnects 314, such as bond wires or ribbon bonds, connect the first active side 310 and a predetermined selection of the external interconnects 305.

The first encapsulation 301 covers the first active side 310 and exposes the first non-active side 312 in the device cavity 302. The first encapsulation 301 also covers the first lower interconnects 314. The first encapsulation 301 covers the inner portion of the first portion 304 of the external interconnects 305.

A first device 316, such as an integrated circuit die, having a first non-passive side 318 and a first passive side 320 is preferably over the first integrated circuit die 308 and in the device cavity 302. The first passive side 320 faces the first non-active side 312. First upper interconnects 322, such as bond wires or ribbon bonds, connect the first non-passive side 318 and a predetermined selection of the external interconnects 305.

A second device 326, such as an integrated circuit die, having a second non-passive side 328 and a second passive side 330 is preferably over the first device 316 and the device cavity 302. The second passive side 330 faces the first active side 310. The first upper interconnects 322, connect the second non-passive side 328 and a predetermined selection of the external interconnects 305. For illustrative purposes, the first device 316 and the second device 326 are shown both connecting with the external interconnects 305 with the first upper interconnects 322, although it is understood that the interconnect type may not be the same to connect to the first device 316 and the second device 326.

The cover 306 covers the first device 316, the first upper interconnects 322, the first non-active side 312, the second device 326, and the inner portion of the first portion 304 of the external interconnects 305. The cover 306 fills the device cavity 302. The first encapsulation 301 and the cover 306 form a hermetic interface with each other forming a package encapsulation 324 for the integrated circuit package system 300.

Figure 4:
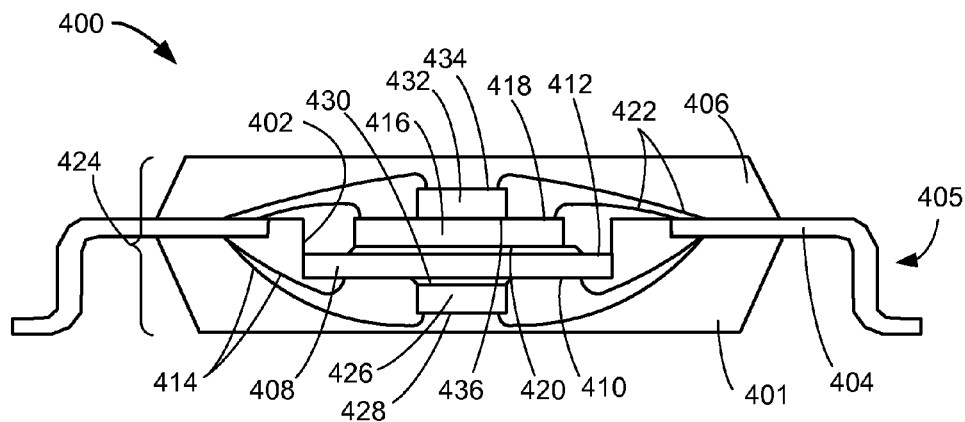
FIG. 4 is a cross-sectional view of an integrated circuit package system along line 2-2 of a bottom view as exemplified by FIG. 1 in a third embodiment of the present invention.

Referring now to FIG. 4, therein is shown a cross-sectional view of an integrated circuit package system 400 along line 2-2 of a bottom view as exemplified by FIG. 1 in a third embodiment of the present invention. The cross-sectional view depicts a first encapsulation 401 having a device cavity 402 extending below a first portion 404 of external interconnects 405. The cross-sectional view also depicts a cover 406, such as an epoxy molding compound, over the first encapsulation 401.

A first integrated circuit die 408 having a first active side 410 and a first non-active side 412 is preferably in the device cavity 402. The first active side 410 preferably faces the first encapsulation 401 and the first non-active side 412 faces upwards and away from the first encapsulation 401. First lower interconnects 414, such as bond wires or ribbon bonds, connect the first active side 410 and a predetermined selection of the external interconnects 405.

A second integrated circuit die 426 having a second active side 428 and a second non-active side 430 preferably stacks below the first integrated circuit die 408. The second non-active side 430 faces the first active side 410. The first lower interconnects 414 also connect the second active side 428 and a predetermined selection of the first portion 404 of the external interconnects 405. For illustrative purposes, the first integrated circuit die 408 and the second integrated circuit die 426 are shown both connecting with the external interconnects 405 with the first lower interconnects 414, although it is understood that the interconnect type may not be the same to connect to the first integrated circuit die 408 and the second integrated circuit die 426.

The first encapsulation 401 covers the first active side 410 and exposes the first non-active side 412 in the device cavity 402. The first encapsulation 401 also covers the first lower interconnects 414 and the second integrated circuit die 426. The first encapsulation 401 covers the inner portion of the first portion 404 of the external interconnects 405.

A first device 416, such as an integrated circuit die, having a first non-passive side 418 and a first passive side 420 is preferably over the first integrated circuit die 408 and in the device cavity 402. The first passive side 420 faces the first non-active side 412. First upper interconnects 422, such as bond wires or ribbon bonds, connect the first non-passive side 418 and a predetermined selection of the external interconnects 405.

A second device 432, such as an integrated circuit die, having a second non-passive side 434 and a second passive side 436 is preferably over the first device 416 and the device cavity 402. The second passive side 436 faces the first active side 410. The first upper interconnects 422, connect the second non-passive side 434 and a predetermined selection of the external interconnects 405. For illustrative purposes, the first device 416 and the second device 432 are shown both connecting with the external interconnects 405 with the first upper interconnects 422, although it is understood that the interconnect type may not be the same to connect to the first device 416 and the second device 432.

The cover 406 covers the first device 416, the first upper interconnects 422, the first non-active side 412, the second device 432, and the inner portion of the first portion 404 of the external interconnects 405. The cover 406 fills the device cavity 402. The first encapsulation 401 and the cover 406 form a hermetic interface with each other forming a package encapsulation 424 for the integrated circuit package system 400.

Figure 5:
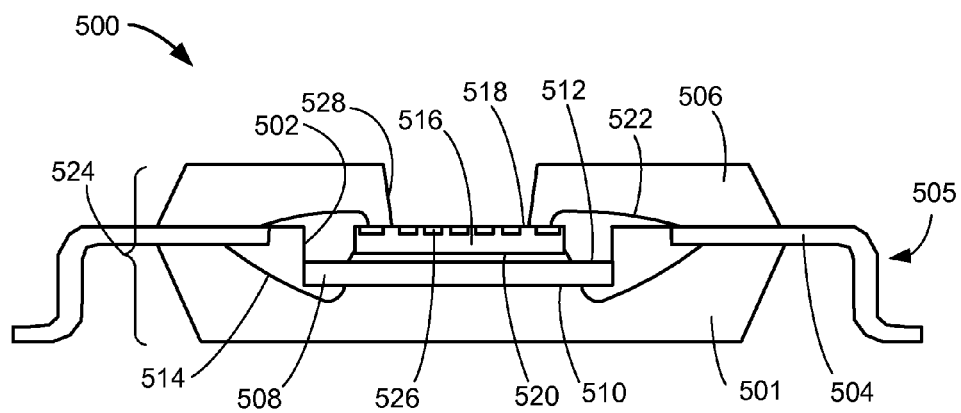
FIG. 5 is a cross-sectional view of an integrated circuit package system along line 2-2 of a bottom view as exemplified by FIG. 1 in a fourth embodiment of the present invention.

Referring now to FIG. 5, therein is shown a cross-sectional view of an integrated circuit package system 500 along line 2-2 of a bottom view as exemplified by FIG. 1 in a fourth embodiment of the present invention. The cross-sectional view depicts a first encapsulation 501 having a device cavity 502 extending below a first portion 504 of external interconnects 505. The cross-sectional view also depicts a cover 506, such as an epoxy molding compound, over the first encapsulation 501.

A first integrated circuit die 508 having a first active side 510 and a first non-active side 512 is preferably in the device cavity 502. The first active side 510 preferably faces the first encapsulation 501 and the first non-active side 512 faces upwards and away from the first encapsulation 501. First lower interconnects 514, such as bond wires or ribbon bonds, connect the first active side 510 and a predetermined selection of the external interconnects 505.

The first encapsulation 501 covers the first active side 510 and exposes the first non-active side 512 in the device cavity 502. The first encapsulation 501 also covers the first lower interconnects 514. The first encapsulation 501 covers the inner portion of the first portion 504 of the external interconnects 505.

A first device 516, such as a laminated substrate or an integrated circuit die having a redistribution layer, having a first non-passive side 518 and a first passive side 520 is preferably over the first integrated circuit die 508 and in the device cavity 502. The first passive side 520 faces the first non-active side 512. First upper interconnects 522, such as bond wires or ribbon bonds, connect pads 526, such as terminal pads, of the first non-passive side 518 and a predetermined selection of the external interconnects 505.

The cover 506 covers the first upper interconnects 522, the first non-active side 512, and the inner portion of the first portion 504 of the external interconnects 505. The cover 506 also fills the device cavity 502. The cover 506 includes a recess 528 exposing the first non-passive side 518. Other devices, such as an integrated circuit die (not shown) or other integrated circuit package system (not shown), may mount over the first device 516 in the recess 528. The first encapsulation 501 and the cover 506 form a hermetic interface with each other forming a package encapsulation 524 for the integrated circuit package system 500.

Figure 6:
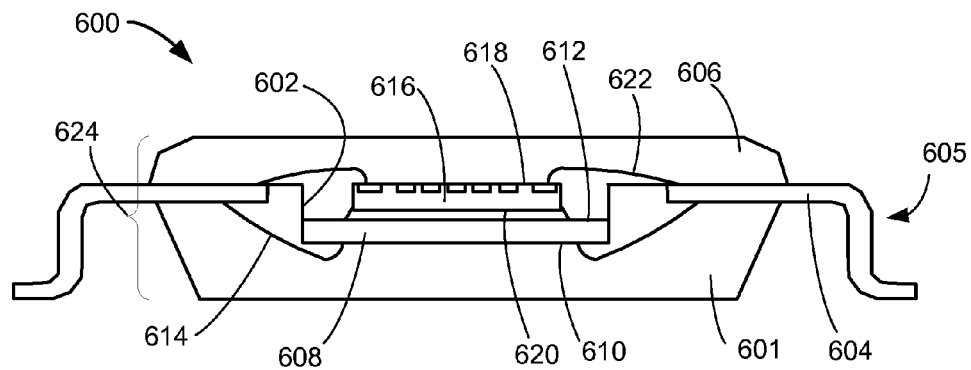
FIG. 6 is a cross-sectional view of an integrated circuit package system along line 2-2 of a bottom view as exemplified by FIG. 1 in a fifth embodiment of the present invention.

Referring now to FIG. 6, therein is shown a cross-sectional view of an integrated circuit package system 600 along line 2-2 of a bottom view as exemplified by FIG. 1 in a fifth embodiment of the present invention. The cross-sectional view depicts a first encapsulation 601 having a device cavity 602 extending below a first portion 604 of external interconnects 605. The cross-sectional view also depicts a cover 606, such as an optically clear grade resin encapsulant, over the first encapsulation 601.

A first integrated circuit die 608 having a first active side 610 and a first non-active side 612 is preferably in the device cavity 602. The first active side 610 preferably faces the first encapsulation 601 and the first non-active side 612 faces upwards and away from the first encapsulation 601. First lower interconnects 614, such as bond wires or ribbon bonds, connect the first active side 610 and a predetermined selection of the external interconnects 605.

The first encapsulation 601 covers the first active side 610 and exposes the first non-active side 612 in the device cavity 602. The first encapsulation 601 also covers the first lower interconnects 614. The first encapsulation 601 covers the inner portion of the first portion 604 of the external interconnects 605.

A first device 616, such as an image sensor, having a first non-passive side 618 and a first passive side 620 is preferably over the first integrated circuit die 608 and in the device cavity 602. The first passive side 620 faces the first non-active side 612. First upper interconnects 622, such as bond wires or ribbon bonds, connect the first non-passive side 618 and a predetermined selection of the external interconnects 605.

The cover 606 covers the first device 616, the first upper interconnects 622, the first non-active side 612, and the inner portion of the first portion 604 of the external interconnects 605. The cover 606 fills the device cavity 602. The optical translucent or transparent properties of the cover 606 allows light to pass through to and from the first device 616. The first encapsulation 601 and the cover 606 form a hermetic interface with each other forming a package encapsulation 624 for the integrated circuit package system 600.

Figure 7:
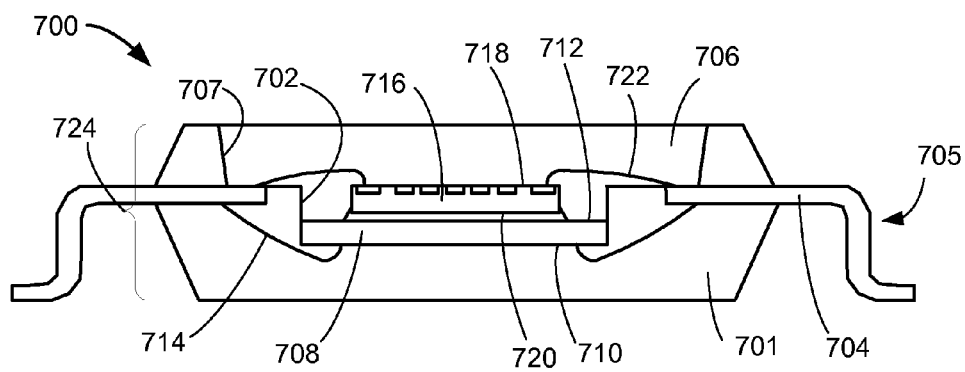
FIG. 7 is a cross-sectional view of an integrated circuit package system along line 2-2 of a bottom view as exemplified by FIG. 1 in a sixth embodiment of the present invention.

Referring now to FIG. 7, therein is shown a cross-sectional view of an integrated circuit package system 700 along line 2-2 of a bottom view as exemplified by FIG. 1 in a sixth embodiment of the present invention. The cross-sectional view depicts a first encapsulation 701 having a device cavity 702 extending below a first portion 704 of external interconnects 705. The cross-sectional view also depicts a cover 706, such as an optically clear grade resin encapsulant, over and within a recess 707 of the first encapsulation 701.

A first integrated circuit die 708 having a first active side 710 and a first non-active side 712 is preferably in the device cavity 702. The first active side 710 preferably faces the first encapsulation 701 and the first non-active side 712 faces upwards and away from the first encapsulation 701. First lower interconnects 714, such as bond wires or ribbon bonds, connect the first active side 710 and a predetermined selection of the external interconnects 705.

The first encapsulation 701 covers the first active side 710 and exposes the first non-active side 712 in the device cavity 702. The first encapsulation 701 also covers the first lower interconnects 714. The first encapsulation 701 covers the inner portion of the first portion 704 of the external interconnects 705. The first encapsulation 701 exposes the cover 706.

For illustrative purposes, the integrated circuit package system 700 is shown with the first encapsulation 701 having the recess 707 and the cover 706 therein, although it is understood that the surrounding encapsulation around the cover 706 may be different than the first encapsulation 701. For example, the surrounding encapsulation may have different properties from the first encapsulation 701. The surrounding encapsulation may absorb light aiding in collimating light through the cover 706.

A first device 716, such as an image sensor, having a first non-passive side 718 and a first passive side 720 is preferably over the first integrated circuit die 708 and in the device cavity 702. The first passive side 720 faces the first non-active side 712. First upper interconnects 722, such as bond wires or ribbon bonds, connect the first non-passive side 718 and a predetermined selection of the external interconnects 705.

The cover 706 covers the first device 716, the first upper interconnects 722, the first non-active side 712, and the inner portion of the first portion 704 of the external interconnects 705. The cover 706 fills the device cavity 702. The optical translucent or transparent properties of the cover 706 allows light to pass through to and from the first device 716. The first encapsulation 701 and the cover 706 form a hermetic interface with each other forming a package encapsulation 724 for the integrated circuit package system 700.

Figure 8:
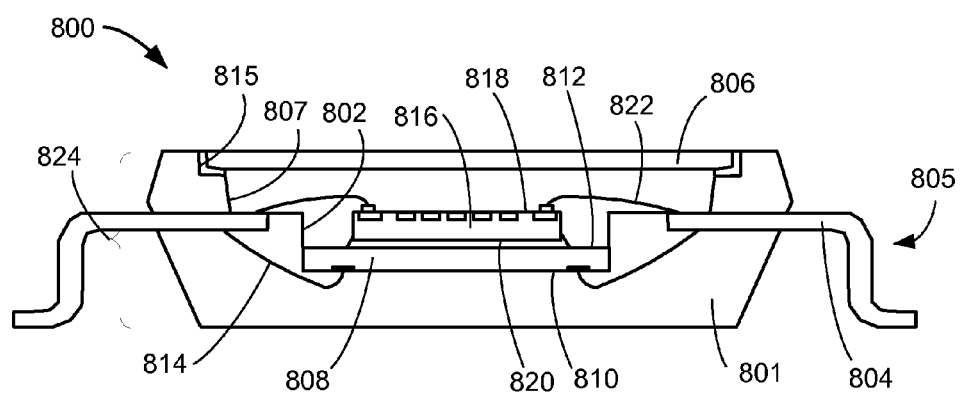
FIG. 8 is a cross-sectional view of an integrated circuit package system along line 2-2 of a bottom view as exemplified by FIG. 1 in a seventh embodiment of the present invention.

Referring now to FIG. 8, therein is shown a cross-sectional view of an integrated circuit package system 800 along line 2-2 of a bottom view as exemplified by FIG. 1 in a seventh embodiment of the present invention. The cross-sectional view depicts a first encapsulation 801 having a device cavity 802 extending below a first portion 804 of external interconnects 805. The cross-sectional view also depicts a cover 806, such as an optical glass, over and within a stepped recess 807 of the first encapsulation 801.

A first integrated circuit die 808 having a first active side 810 and a first non-active side 812 is preferably in the device cavity 802. The first active side 810 preferably faces the first encapsulation 801 and the first non-active side 812 faces upwards and away from the first encapsulation 801. First lower interconnects 814, such as bond wires or ribbon bonds, connect the first active side 810 and a predetermined selection of the external interconnects 805.

The first encapsulation 801 covers the first active side 810 and exposes the first non-active side 812 in the device cavity 802. The first encapsulation 801 also covers the first lower interconnects 814. The first encapsulation 801 covers the inner portion of the first portion 804 of the external interconnects 805. The cover 806 is attached to the first encapsulation 801 in an indentation 815 of the stepped recess 807.

For illustrative purposes, the integrated circuit package system 800 is shown with the first encapsulation 801 having the stepped recess 807 and the cover 806 therein, although it is understood that the surrounding encapsulation around the cover 806 may be different than the first encapsulation 801. For example, the surrounding encapsulation may have different properties from the first encapsulation 801. The surrounding encapsulation may absorb light aiding in collimating light through the cover 806.

A first device 816, such as an image sensor, having a first non-passive side 818 and a first passive side 820 is preferably over the first integrated circuit die 808 and in the device cavity 802. The first passive side 820 faces the first non-active side 812. First upper interconnects 822, such as bond wires or ribbon bonds, connect the first non-passive side 818 and a predetermined selection of the external interconnects 805.

The cover 806 covers the first device 816, the first upper interconnects 822, and the first non-active side 812 exposed in the device cavity 802. A number of items may occupy the stepped recess 807 below the cover 806 and the device cavity 802. For example, the stepped recess 807 below the cover 806 and the device cavity 802 may be a vacuum, filled with air (not shown), filled with an inert gas (not shown), or may have an optically translucent encapsulation (not shown). The first encapsulation 801 and the cover 806 form a hermetic interface with each other forming a package encapsulation 824 for the integrated circuit package system 800.

Figure 9:
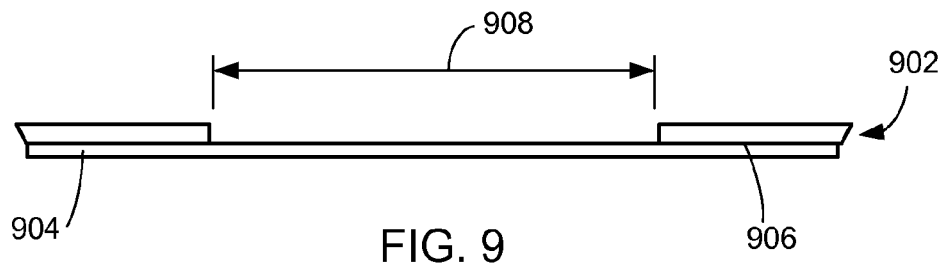
FIG. 9 is a cross-sectional view of a lead frame.

Referring now to FIG. 9, therein is shown a cross-sectional view of a lead frame 902. The lead frame 902 is on a tape 904, such as a coverlay tape. The tape 904 attaches to a first side 906 of the lead frame 902 and provides a planar surface between the first side 906 and a space 908 within the lead frame 902.

Figure 10:
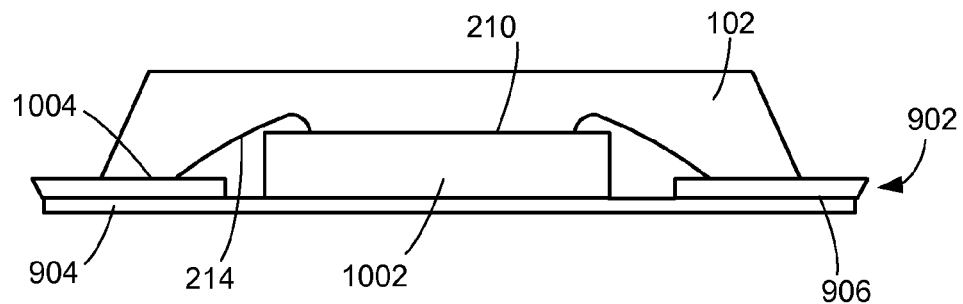
FIG. 10 is the structure of FIG. 9 in a forming phase of the first encapsulation.

Referring now to FIG. 10, therein is shown the structure of FIG. 9 in a forming phase of the first encapsulation 102. An integrated circuit die 1002, such as the first integrated circuit die 208 of FIG. 2 without thinning, mounts on the tape 904 with the first active side 210 facing away from the tape 904. The first lower interconnects 214 connect the first active side 210 and a second side 1004 of the lead frame 902. The tape 904 secures the integrated circuit die 1002 to be coplanar with the first side 906.

The first encapsulation 102 is formed covering the integrated circuit die 1002 and the first lower interconnects 214. The first encapsulation 102 partially covers the second side 1004. The tape 904 prevents the first encapsulation 102 from covering the first side 906. The first encapsulation 102 may be formed in a number of ways, such as injection molding with a mold cap (not shown) over the integrated circuit die 1002, the first lower interconnects 214, and the lead frame 902.

Figure 11:
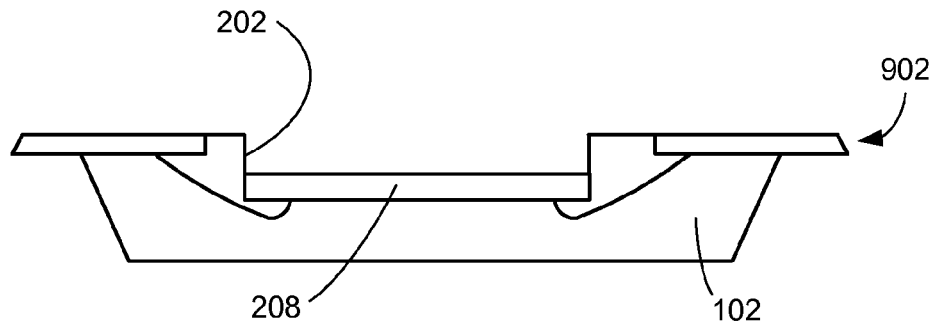
FIG. 11 is the structure of FIG. 10 in a forming phase of the first integrated circuit die.

Referring now to FIG. 11, therein is shown the structure of FIG. 10 in a forming phase of the first integrated circuit die 208. The structure of FIG. 10 is vertically flipped providing the first encapsulation 102 below the lead frame 902. The tape 904 of FIG. 10 has been removed or peeled from the lead frame 902 exposing the first encapsulation 102 and the integrated circuit die 1002 of FIG. 10.

The exposed portion of the integrated circuit die 1002 undergoes a thinning process whereby a portion of the exposed side of the integrated circuit die 1002 removed forming the first integrated circuit die 208 and the device cavity 202 in the first encapsulation 102. The thinning process may be performed by a number of processes, such as die etching.

For illustrative purpose, the thinning process is shown forming the device cavity 202 having substantially the same width as the first integrated circuit die 208, although it is understood that the device cavity 202 may have a different width than the width of the first integrated circuit die 208. For example, the integrated circuit die 1002 may be locally thinned forming a localized recess (not shown) within the backside of the integrated circuit die 1002.

Figure 12:
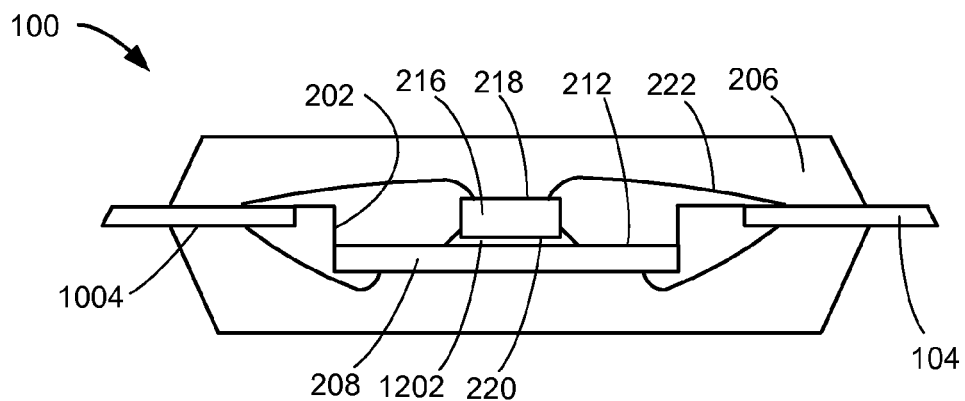
FIG. 12 is the structure of FIG. 11 in a forming phase of the cover.

Referring now to FIG. 12, therein is shown the structure of FIG. 11 in a forming phase of the cover 206. The first device 216 mounts over the first integrated circuit die 208 in the device cavity 202. The first passive side 220 attaches to the first non-active side 212 with an adhesive 1202, such as a die-attach adhesive. The first upper interconnects 222 connect the first non-passive side 218 and the second side 1004 of the lead frame 902 of FIG. 11.

The cover 206 is formed covering the first device 216, the first upper interconnects 222, and the first non-active side 212 filling in the device cavity 202. The cover 206 partially covers the second side 1004. The cover 206 may be formed in a number of ways, such as injection molding with a mold cap (not shown) over the first integrated circuit die 208, the first upper interconnects 222, and the lead frame 902. The lead frame 902 may undergo formation of the external interconnects 104, such as bending or stamping, and singulation forming the integrated circuit package system 100.

Figure 13:
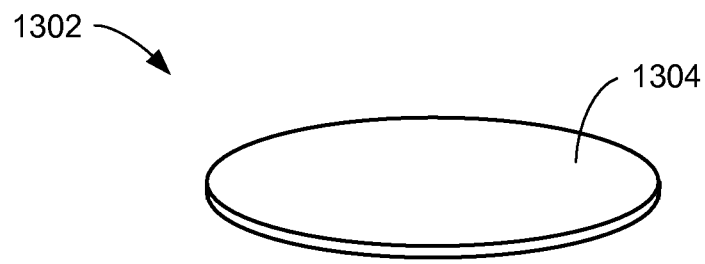
FIG. 13 is a perspective view of a wafer in a thinning phase.

Referring now to FIG. 13, therein is shown a perspective view of a wafer 1302 in a thinning phase. The perspective view depicts a back portion 1304 of the wafer 1302. The wafer 1302 undergoes a thinning process from the back portion 1304. The back portion 1304 does not have active circuitry or active elements thereon. The back portion 1304 may be thinned with a number of processes, such as lapping, grinding, or etching.

Figure 14:
FIG. 14 is the structure of FIG. 13 in a forming phase of the backside element.

Referring now to FIG. 14, therein is shown the structure of FIG. 13 in a forming phase of a backside element 1402. The backside element 1402, also referred to as backside concealer, may be a number of different materials, such as a plastic layer, a polymer film, solder, copper, aluminum, or an silica filled epoxy mold compound. The backside element 1402 provides planar rigidity to the wafer 1302.

The backside element 1402 may be formed at the back portion 1304 in a number of ways. For example, the plastic layer may be formed with screen printing and cured epoxy paste. Another example, the polymer film may be formed as a laminated layer. Yet another example, the backside element 1402 may be premolded.

Figure 15:
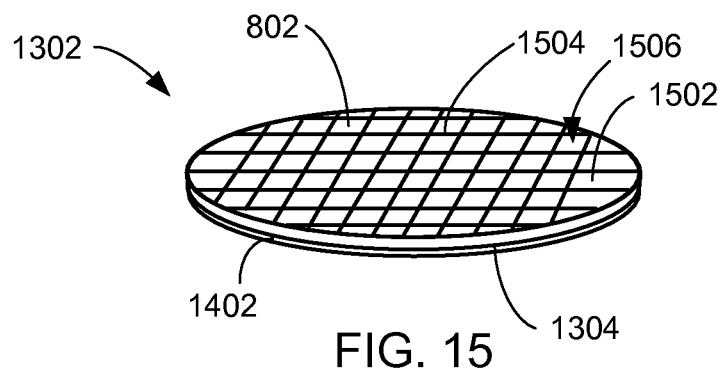
FIG. 15 is the structure of FIG. 14 in a singulating phase of the wafer.

Referring now to FIG. 15, therein is shown the structure of FIG. 14 in a singulating phase of the wafer 1302. The wafer 1302 is in a vertically flipped orientation to that shown in FIG. 14 displaying an active portion 1502 of the wafer 1302. The active portion 1502 is on an opposing side of the back portion 1304 of FIG. 14. The active portion 1502 includes active circuitry or active elements fabricated thereon.

The backside element 1402 does not cover the active portion 1502. The wafer 1302 undergoes singulation depicted by singulation lines 1504. A portion of the wafer 1302 within the singulation lines 1504 is an integrated circuit die 1506.

Figure 16:
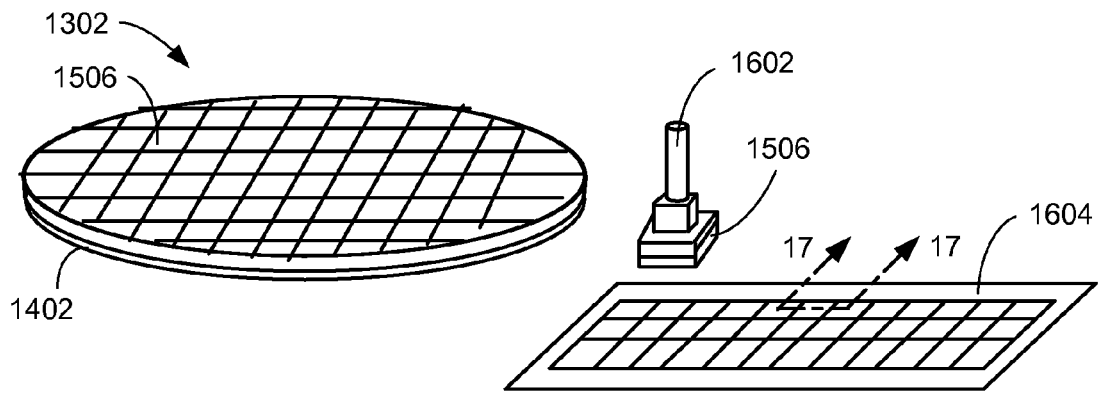
FIG. 16 is the structure of FIG. 15 in a separating phase of the integrated circuit die.

Referring now to FIG. 16, therein is shown the structure of FIG. 15 in a separating phase of the integrated circuit die 1506. A removal apparatus 1602, such as a pick and place mechanism, removes the integrated circuit die 1506 from the wafer 1302 and moves the integrated circuit die 1506 to a lead frame 1604. The integrated circuit die 1506 also has the backside element 1402.

Figure 17:
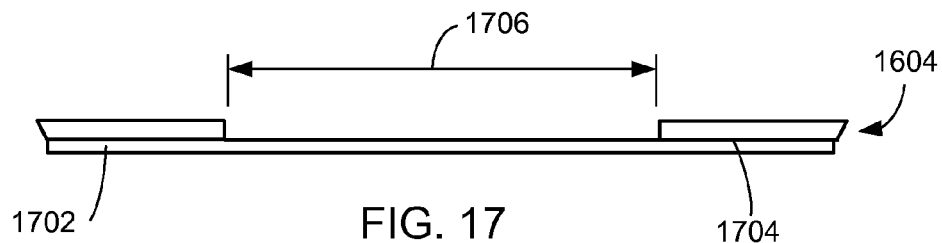
FIG. 17 is a cross-sectional view of the lead frame of FIG. 16 along line 17-17.

Referring now to FIG. 17, therein is shown a cross-sectional view of the lead frame 1604 of FIG. 16 along line 17-17. The lead frame 1604 may be similar or substantially the same as the lead frame 902 of FIG. 9. The lead frame 1604 is on a tape 1702, such as a coverlay tape. The tape 1702 attaches to a first side 1704 of the lead frame 1604 and provides a planar surface between the first side 1704 and a space 1706 within the lead frame 1604.

Figure 18:
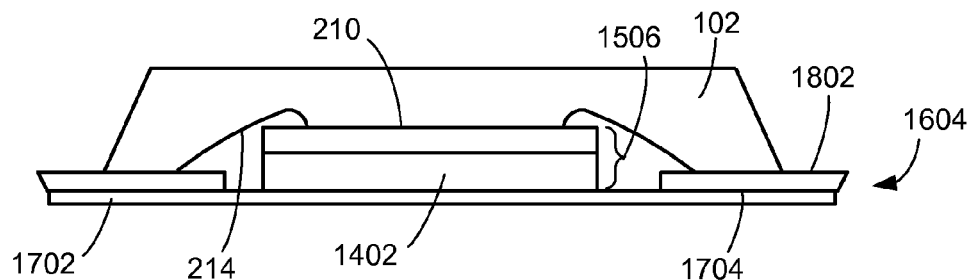
FIG. 18 is the structure of FIG. 17 in a forming phase of the first encapsulation.

Referring now to FIG. 18, therein is shown the structure of FIG. 17 in a forming phase of the first encapsulation 102. The integrated circuit die 1506 mounts on the tape 1702 with the backside element 1402 substantially coplanar with the first side 1704 of the lead frame 1604.

The first lower interconnects 214 connect the first active side 210 and a second side 1802 of the lead frame 1604. The tape 1702 secures the backside element 1402 to be coplanar with the first side 1704 of the lead frame 1604.

The first encapsulation 102 is formed covering the integrated circuit die 1506 and the first lower interconnects 214. The first encapsulation 102 partially covers the second side 1802. The tape 1702 prevents the first encapsulation 102 from covering the first side 1704. The first encapsulation 102 may be formed in a number of ways, such as injection molding with a mold cap (not shown) over the integrated circuit die 1506, the first lower interconnects 214, and the lead frame 1604.

Figure 19:
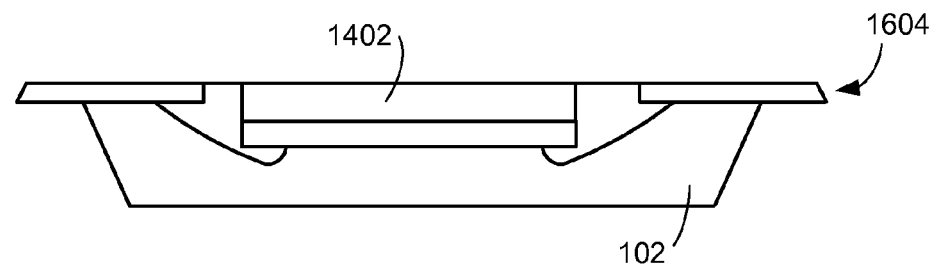
FIG. 19 is the structure of FIG. 18 in a removing phase of the tape of FIG. 18.

Referring now to FIG. 19, therein is shown the structure of FIG. 18 in a removing phase of the tape 1702 of FIG. 18. The structure of FIG. 18 is vertically flipped providing the first encapsulation 102 below the lead frame 1604. The tape 1702 has been removed or peeled from the lead frame 1604 exposing the first encapsulation 102 and the backside element 1402.

Figure 20:
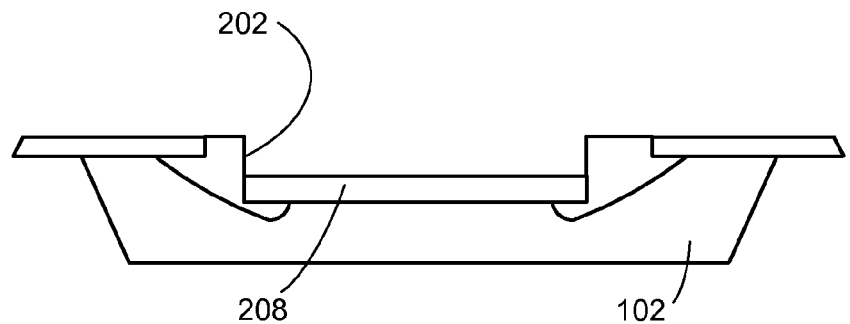
FIG. 20 is the structure of FIG. 19 in a forming phase of the first integrated circuit die.

Referring now to FIG. 20, therein is shown the structure of FIG. 19 in a forming phase of the first integrated circuit die 208. The backside element 1402 undergoes a removal process forming the first integrated circuit die 208 and the device cavity 202 in the first encapsulation 102. The removal process may be performed by a number of processes, such as etching, dissolving, or tape-assisted peeling.

Figure 21:
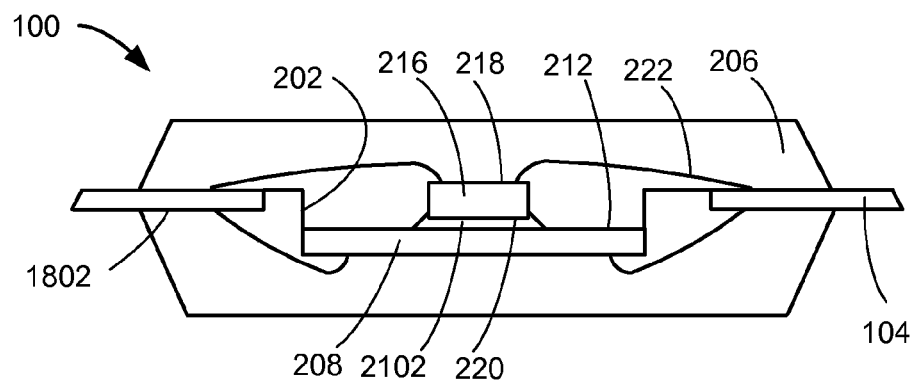
FIG. 21 is the structure of FIG. 20 in a forming phase of the cover.

Referring now to FIG. 21, therein is shown the structure of FIG. 20 in a forming phase of the cover 206. The first device 216 mounts over the first integrated circuit die 208 in the device cavity 202. The first passive side 220 attaches to the first non-active side 212 with an adhesive 2102, such as a die-attach adhesive. The first upper interconnects 222 connect the first non-passive side 218 and the second side 1802 of the lead frame 1604 of FIG. 19.

The cover 206 is formed covering the first device 216, the first upper interconnects 222, and the first non-active side 212 filling in the device cavity 202. The cover 206 partially covers the second side 1802. The cover 206 may be formed in a number of ways, such as injection molding with a mold cap (not shown) over the first integrated circuit die 208, the first upper interconnects 222, and the lead frame 1604. The lead frame 1604 may undergo formation of the external interconnects 104, such as bending or stamping, and singulation forming the integrated circuit package system 100.

Figure 22:
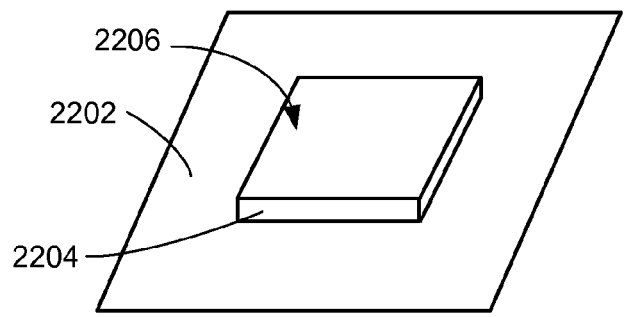
FIG. 22 is an isometric view of a tape having an integral protrusion.

Referring now to FIG. 22, therein is shown an isometric view of a tape 2202 having an integral protrusion 2204. The tape 2202 may be a coverlay tape having the integral protrusion 2204. The integral protrusion 2204 is shown in a rectangular geometric configuration. The integral protrusion 2204 is shown having a planar surface 2206. For illustrative purposes, the tape 2202 is shown with the integral protrusion 2204, although it is understood that the tape 2202 may have more than one of the integral protrusion 2204.

Figure 23:
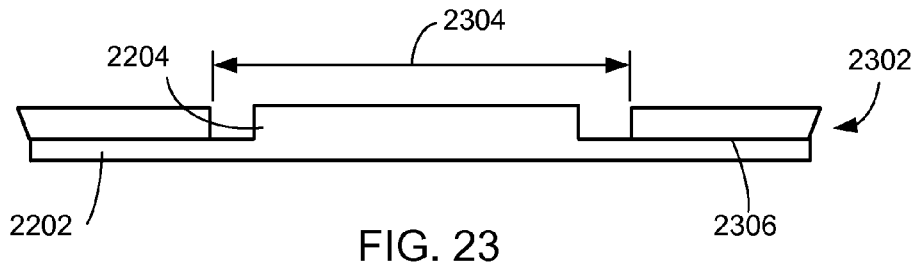
FIG. 23 is a cross-sectional view of a lead frame.

Referring now to FIG. 23, therein is shown a cross-sectional view of a lead frame 2302. The lead frame 2302 may be similar or substantially the same as the lead frame 902 of FIG. 9. The lead frame 2302 is on the tape 2202 with the integral protrusion 2204 within a space 2304 of the lead frame 2302. The tape 2202 attaches to a first side 2306 of the lead frame 2302 and provides a planar surface between the first side 2306 and the space 2304 within the lead frame 2302.

Figure 24:
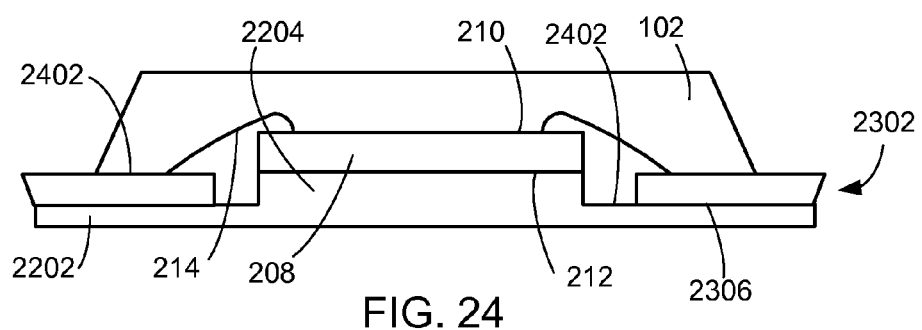
FIG. 24 is the structure of FIG. 23 in a forming phase of the first encapsulation.

Referring now to FIG. 24, therein is shown the structure of FIG. 23 in a forming phase of the first encapsulation 102. The first integrated circuit die 208 mounts over the integral protrusion 2204. For illustrative purposes, a width of the integral protrusion 2204 is shown substantially the same as a width of the first integrated circuit die 208, although it is understood that the width of the integral protrusion 2204 and the width of the first integrated circuit die 208 may be different. The first lower interconnects 214 connect the first active side 210 and a second side 2402 of the lead frame 2302.

The first encapsulation 102 is formed covering the first integrated circuit die 208, the first lower interconnects 214, and the integral protrusion 2204. The first encapsulation 102 partially covers the second side 2402. The tape 2202 prevents the first encapsulation 102 from covering the first side 2306. The first encapsulation 102 may be formed in a number of ways, such as injection molding with a mold cap (not shown) over the first integrated circuit die 208, the first lower interconnects 214, and the lead frame 2302.

Figure 25:
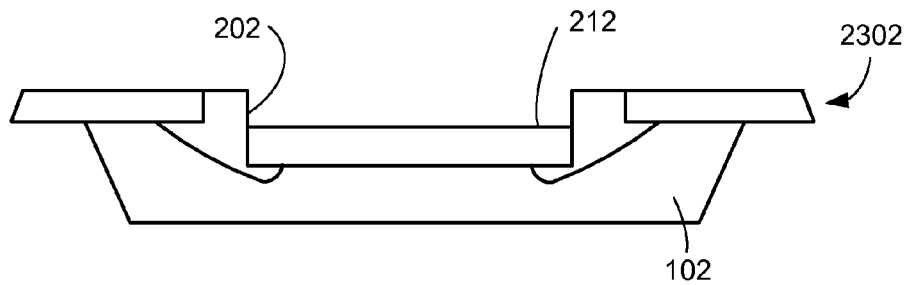
FIG. 25 is the structure of FIG. 24 in a removing phase of the tape of FIG. 24.

Referring now to FIG. 25, therein is shown the structure of FIG. 24 in a removing phase of the tape 2202 of FIG. 24. The structure of FIG. 18 is vertically flipped providing the first encapsulation 102 below the lead frame 2302. The tape 2202 has been removed or peeled from the lead frame 2302 exposing the first encapsulation 102 and the first non-active side 212. The removal of the tape 2202 also removes the integral protrusion 2204 of FIG. 24 forming the device cavity 202.

Figure 26:
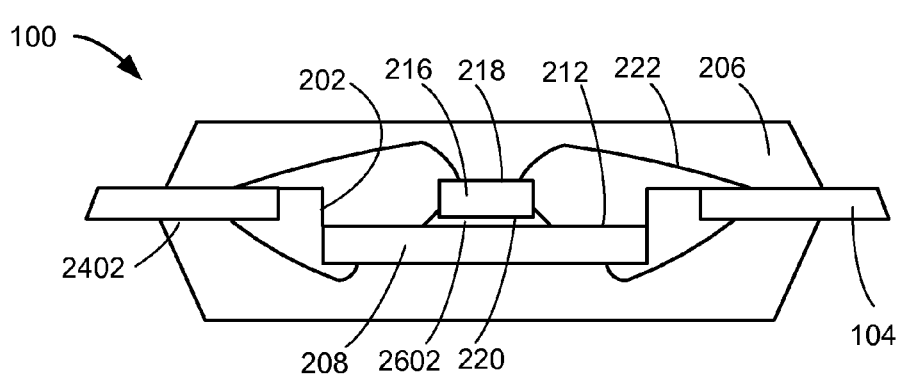
FIG. 26 is the structure of FIG. 25 in a forming phase of the cover.

Referring now to FIG. 26, therein is shown the structure of FIG. 25 in a forming phase of the cover 206. The first device 216 mounts over the first integrated circuit die 208 in the device cavity 202. The first passive side 220 attaches to the first non-active side 212 with an adhesive 2602, such as a die-attach adhesive. The first upper interconnects 222 connect the first non-passive side 218 and the second side 2402 of the lead frame 2302 of FIG. 25.

The cover 206 is formed covering the first device 216, the first upper interconnects 222, and the first non-active side 212 filling in the device cavity 202. The cover 206 partially covers the second side 2402. The cover 206 may be formed in a number of ways, such as injection molding with a mold cap (not shown) over the first integrated circuit die 208, the first upper interconnects 222, and the lead frame 2302. The lead frame 2302 may undergo formation of the external interconnects 104, such as bending or stamping, and singulation forming the integrated circuit package system 100.

Figure 27:
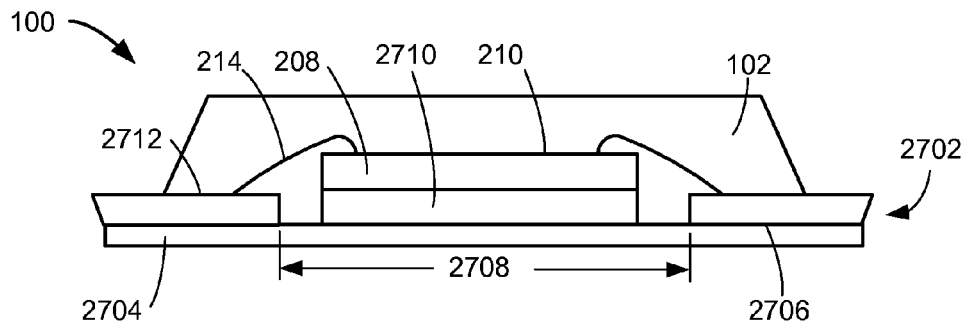
FIG. 27 is a cross-sectional view of the integrated circuit package system of FIG. 2 in a forming phase of the first encapsulation.

Referring now to FIG. 27, therein is shown a cross-sectional view of the integrated circuit package system 100 of FIG. 2 in a forming phase of the first encapsulation 102. A lead frame 2702 is on a tape 2704, such as a coverlay tape. The lead frame 2702 may be similar or substantially the same as the lead frame 902 of FIG. 9. The tape 2704 attaches to a first side 2706 of the lead frame 2702 and provides a planar surface between the first side 2706 and a space 2708 within the lead frame 2702. A spacer 2710, such as a tape segment, is placed on the tape 2704 in the space 2708 within the lead frame 2702.

The first integrated circuit die 208 mounts over the spacer 2710. For illustrative purposes, a width of the spacer 2710 is shown substantially the same as a width of the first integrated circuit die 208, although it is understood that the width of the spacer 2710 and the width of the first integrated circuit die 208 may be different. The first lower interconnects 214 connect the first active side 210 and a second side 2712 of the lead frame 2702.

The first encapsulation 102 is formed covering the first integrated circuit die 208, the first lower interconnects 214, and the spacer 2710. The first encapsulation 102 partially covers the second side 2712. The tape 2704 prevents the first encapsulation 102 from covering the first side 2706. The first encapsulation 102 may be formed in a number of ways, such as injection molding with a mold cap (not shown) over the first integrated circuit die 208, the first lower interconnects 214, and the lead frame 2702.

Figure 28:
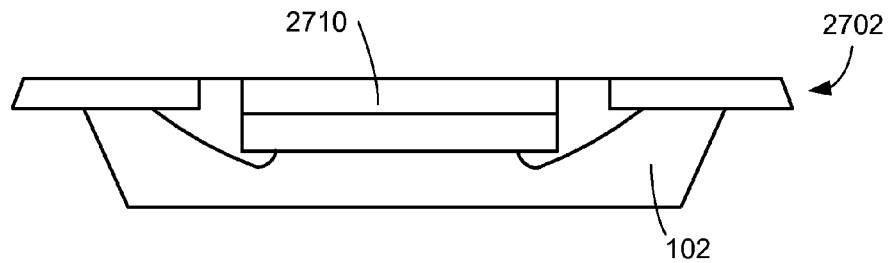
FIG. 28 is the structure of FIG. 27 in a removing phase of the tape of FIG. 27.

Referring now to FIG. 28, therein is shown the structure of FIG. 27 in a removing phase of the tape 2704 of FIG. 27. The structure of FIG. 27 is vertically flipped providing the first encapsulation 102 below the lead frame 2702. The tape 2704 has been removed or peeled from the lead frame 2702 exposing the first encapsulation 102 and the spacer 2710.

Figure 29:
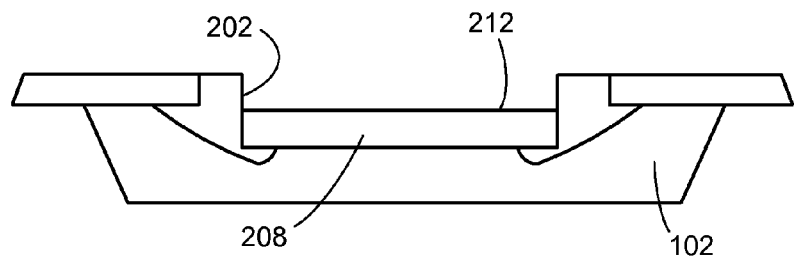
FIG. 29 is the structure of FIG. 28 in a removing phase of the spacer.

Referring now to FIG. 29, therein is shown the structure of FIG. 28 in a removing phase of the spacer 2710. The spacer 2710 undergoes a removal process exposing the first non-active side 212 of the first integrated circuit die 208 and forming the device cavity 202 in the first encapsulation 102. The removal process may be performed by a number of processes, such as tape-assisted peeling or selective dissolving with a solvent.

Figure 30:
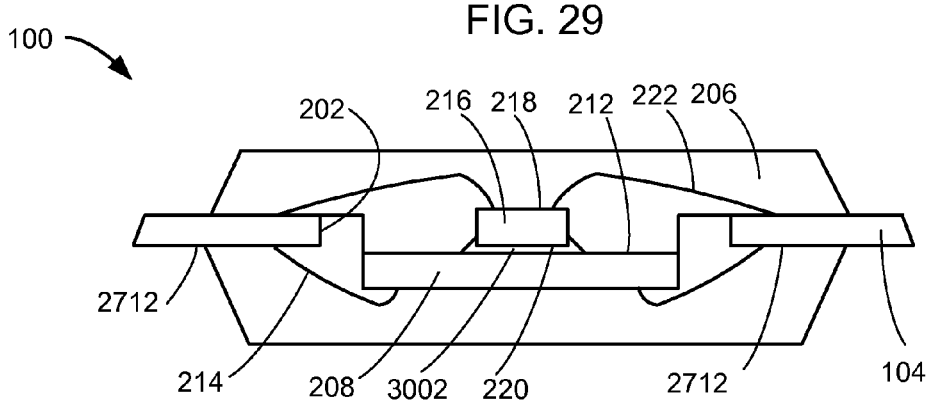
FIG. 30 is the structure of FIG. 29 in forming the cover.

Referring now to FIG. 30, therein is shown the structure of FIG. 29 in forming the cover 206. The first device 216 mounts over the first integrated circuit die 208 in the device cavity 202. The first passive side 220 attaches to the first non-active side 212 with an adhesive 3002, such as a die-attach adhesive. The first upper interconnects 222 connect the first non-passive side 218 and the second side 2712 of the lead frame 2702 of FIG. 28.

The cover 206 is formed covering the first device 216, the first upper interconnects 222, and the first non-active side 212 filling in the device cavity 202. The cover 206 partially covers the second side 2712. The cover 206 may be formed in a number of ways, such as injection molding with a mold cap (not shown) over the first integrated circuit die 208, the first upper interconnects 222, and the lead frame 2702. The lead frame 2702 may undergo formation of the external interconnects 104, such as bending or stamping, and singulation forming the integrated circuit package system 100.

Figure 31:
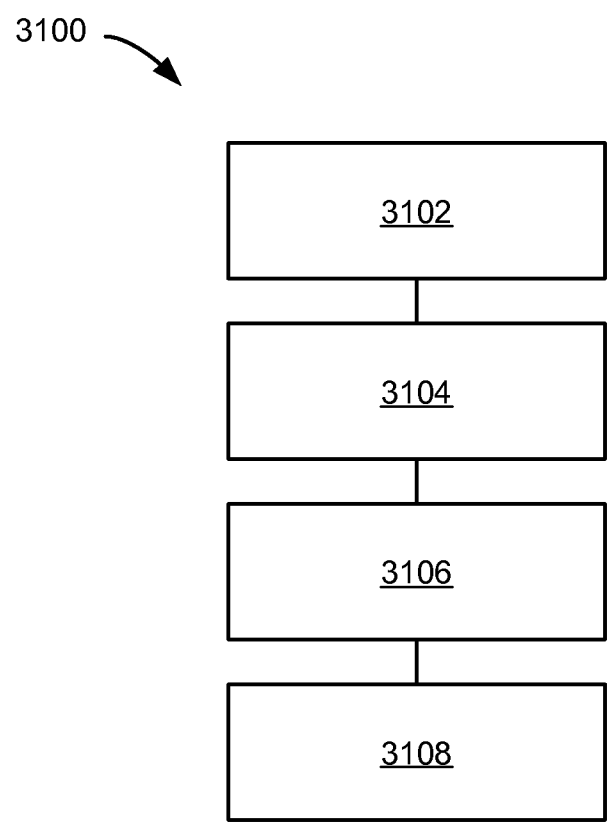
FIG. 31 is a flow chart of an integrated package system for manufacturing the integrated circuit package system in an embodiment of the present invention.

Referring now to FIG. 31, therein is shown a flow chart of an integrated circuit package system 3100 for manufacturing the integrated circuit package system 100 in an embodiment of the present invention. The system 3100 includes connecting an integrated circuit die with an external interconnect in a block 3102; forming a first encapsulation having a device cavity with the integrated circuit die therein in a block 3104; mounting a device in the device cavity over the integrated circuit die in a block 3106; and forming a cover over the device and the first encapsulation in a block 3108.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of integrated circuit package system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit package system comprising:
   connecting an integrated circuit die, having a non-active side, with an external interconnect;
   forming a first encapsulation having a device cavity with the integrated circuit die in the device cavity exposing the non-active side;
   mounting a device in the device cavity over the integrated circuit die; and
   forming a cover over the device and having a non-horizontal cover side facing a non-horizontal encapsulation side of the first encapsulation.

2. The method as claimed in claim 1 wherein forming the first encapsulation having the device cavity with the integrated circuit die in the device cavity includes:
   forming the first encapsulation with the integrated circuit die therein; and
   forming the device cavity by thinning the integrated circuit die.

3. The method as claimed in claim 1 wherein forming the cover includes forming a second encapsulation that fills the device cavity.

4. The method as claimed in claim 1 wherein forming the cover includes forming an optical cover.

5. The method as claimed in claim 1 wherein:
   forming the device includes:
      forming a pad; and
   forming the first encapsulation further includes:
      forming a recess in the first encapsulation with the pad exposed by a recess.

6. A method of manufacturing an integrated circuit package system comprising:
   connecting a first integrated circuit die, having an active side and a non-active side, with an external interconnect;
   forming a first encapsulation having a device cavity with the first integrated circuit die in the device cavity exposing the non-active side;
   mounting a first device in the device cavity over the non-active side;
   connecting the first device with the external interconnect; and
   forming a cover over the first device and having a non-horizontal cover side facing a non-horizontal encapsulation side of the first encapsulation to define a package encapsulation.

7. The method as claimed in claim 6 further comprising mounting a second integrated circuit die over the active side of the first integrated circuit die.

8. The method as claimed in claim 6 further comprising mounting a second device over the first device.

9. The method as claimed in claim 6 further comprising:
forming a backside element on the non-active side of the first integrated circuit die;
wherein forming the first encapsulation having the device cavity with the first integrated circuit die in the device cavity includes:
forming the first encapsulation with the first integrated circuit die and the backside element therein; and
forming the device cavity by removing the backside element.

10. The method as claimed in claim 6 further comprising:
attaching a tape on the non-active side of the first integrated circuit die;
wherein forming the first encapsulation having the device cavity with the first integrated circuit die in the device cavity includes:
forming the first encapsulation with the first integrated circuit die attached to the tape; and
forming the device cavity by removing the tape.

* * * * *